United States Patent
Chen et al.

(10) Patent No.: US 12,032,303 B2
(45) Date of Patent: Jul. 9, 2024

(54) EUV WAFER DEFECT IMPROVEMENT AND METHOD OF COLLECTING NONCONDUCTIVE PARTICLES

(71) Applicant: TAIWAN SEMICONDUCTOR MANUFACTURING COMPANY, LTD., Hsinchu (TW)

(72) Inventors: Tao-Hsin Chen, Tainan (TW); Li-Jui Chen, Hsinchu (TW); Chia-Yu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/504,199

(22) Filed: Oct. 18, 2021

(65) Prior Publication Data

US 2022/0100105 A1  Mar. 31, 2022

Related U.S. Application Data

(63) Continuation of application No. 17/037,558, filed on Sep. 29, 2020, now Pat. No. 11,150,564.

(51) Int. Cl.
  *G03F 7/00*  (2006.01)
(52) U.S. Cl.
  CPC ...... *G03F 7/70925* (2013.01); *G03F 7/70483* (2013.01)
(58) Field of Classification Search
  CPC .................................................. G03F 7/70925
  See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |

(Continued)

FOREIGN PATENT DOCUMENTS

| | | | | |
|---|---|---|---|---|
| JP | 2018082128 A | * | 5/2018 | ............ G03F 7/0002 |
| KR | 1999073897 A | * | 10/1999 | ....... H01L 21/67028 |

OTHER PUBLICATIONS

Machine English Translation of KR-19990073897-A.*

(Continued)

*Primary Examiner* — Steven Whitesell Gordon
(74) *Attorney, Agent, or Firm* — STUDEBAKER & BRACKETT PC

(57) ABSTRACT

An EUV lithographic apparatus includes a wafer stage and a particle removing assembly for cleaning a wafer for an extreme ultraviolet (EUV) lithographic apparatus. The wafer stage includes a measurement side and an exposure side. The particle removing assembly includes particle removing electrodes, an exhaust device and turbomolecular pumps. The particle removing electrodes is configured to direct debris from the chamber by suppressing turbulence such that the debris can be exhausted from the wafer stage to the outside of the processing apparatus. In some embodiments, turbomolecular pumps are turned off in the measurement side of the wafer stage so that an exhaust flow can be guided to an exposure side of the wafer stage. In some embodiments, the speed of voltage rise to the electrodes of the wafer chuck is adjusted.

20 Claims, 17 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2002/0096647 A1* | 7/2002 | Moors .................. G03F 7/7085 250/492.1 |
| 2007/0075276 A1* | 4/2007 | Nolscher ............. G03F 7/70916 250/504 R |
| 2008/0073571 A1 | 3/2008 | Imoto et al. |
| 2008/0267816 A1 | 10/2008 | Ueno et al. |
| 2009/0128795 A1* | 5/2009 | Hayashi ................ G03B 27/62 355/75 |
| 2010/0068659 A1* | 3/2010 | Hamaya ............. G03F 7/70841 355/53 |
| 2010/0243922 A1 | 9/2010 | Asayama et al. |
| 2011/0222040 A1 | 9/2011 | Steinhoff et al. |
| 2013/0313423 A1 | 11/2013 | Umstadter |
| 2014/0312227 A1* | 10/2014 | Yoshikawa ........... H01J 37/023 250/310 |
| 2016/0207051 A1* | 7/2016 | Tatsumi .................... B03C 3/68 |
| 2019/0146349 A1 | 5/2019 | Wu et al. |
| 2019/0366619 A1* | 12/2019 | Terashima .......... B29C 37/0053 |
| 2020/0348606 A1* | 11/2020 | Perez-Falcon .......... G03F 7/707 |

OTHER PUBLICATIONS

Machine English Translation of JP-2018082128-A.*
Non-Final Office Action issued in U.S. Appl. No. 17/037,558, dated Mar. 24, 2021.
Notice of Allowance issued in U.S. Appl. No. 17/037,558, dated Jun. 18, 2021.

\* cited by examiner

EUV WAFER DEFECT IMPROVEMENT AND METHOD OF COLLECTING NONCONDUCTIVE PARTICLES

RELATED APPLICATIONS

This application is a continuation of U.S. patent application Ser. No. 17/037,558 filed Sep. 29, 2020, now U.S. Pat. No. 11,150,564, the entire content of which is incorporated herein by reference.

BACKGROUND

In an extreme ultraviolet (EUV) lithography, debris particles can reduce the yield of the lithography by undesirably shielding portions of a wafer. It is, therefore, desirable to maintain a clean environment in locations where the wafer passes through during the lithography process such as tool grippers, chambers, mask holders, etc. In particular, the ability to produce high quality microelectronic devices and reduce yield losses is dependent upon maintaining the surfaces of critical components substantially particle or contaminant-free. This would include maintaining the surfaces free of contaminants, e.g., maintaining an ultra-clean surface ensuring that contaminants is not deposited on the surface of the wafer, the reticle or mask or other critical components. This is of particular concern as finer features are required on the microelectronic device. The types of contaminants can be any arbitrary combination depending on the environment and the vacuum condition. The contaminants could be introduced from such as etching byproducts in the mask making process, organic hydrocarbon contaminants, any kind of fall-on dust, outgassing from steel, and so on.

The present disclosure relates to a contaminant and/or debris particle removing assembly that is designed to remove such contaminants and/or debris particles to improve cleanliness of semiconductor wafer process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

EUV lithographic equipment is cleaned using a vacuum and an isopropyl alcohol/ethanol wipe-down, and particle counters are used to monitor and verify cleanliness. However, such manual cleaning may not completely remove contaminants from vacuum chambers. Moreover, wipe-down and/or vacuum cleaning of delicate or small components is not desirable. Additionally, these procedures are not specific to cables and a cable raceway/trough through which cables would pass or potentially generate contaminants and/or debris particles from bending portions of the cable that are in direct contact with the edge of the raceway/trough. Thus, alternate methods of maintaining cleanliness of the semiconductor wafer process are desirable.

Figure 1:
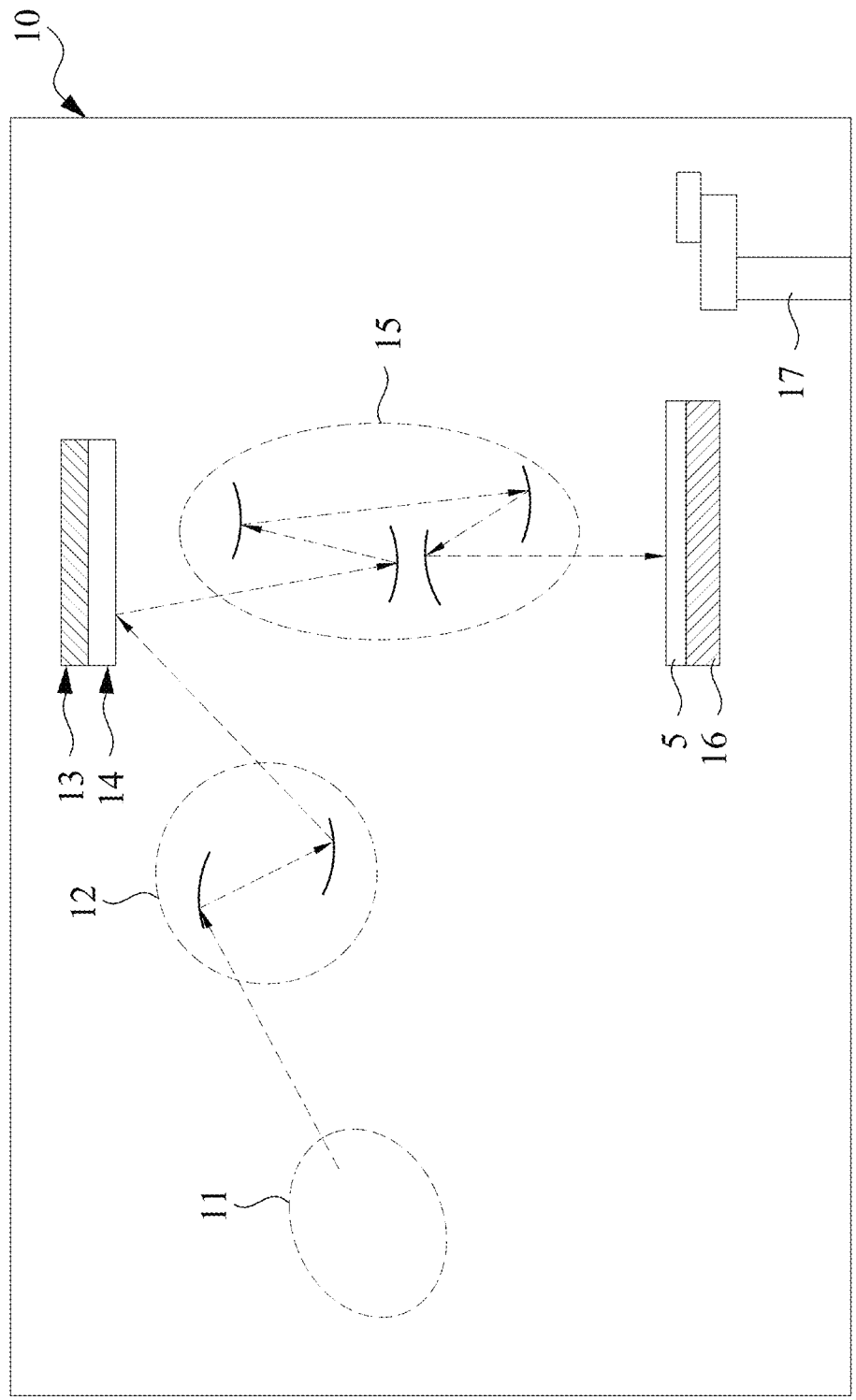
FIG. 1 shows a schematic view of an EUV lithography system, in accordance with some embodiments.

FIG. 1 is a schematic view of an EUV lithography system in accordance with some embodiments. In some embodiments, the EUV lithography system includes a processing apparatus 10 and a controller. It should be appreciated that the features described below can be replaced or eliminated in other embodiments of the EUV lithography system.

In some embodiments, the processing apparatus 10 includes a high-brightness light source 11, an illuminator 12, a mask stage 13, a mask 14, a projection optics module 15, a wafer stage 16, and a wafer transfer system 17. The elements of the processing apparatus 10 can be added to or omitted, and the invention should not be limited by the embodiment.

The high-brightness light source 11 is configured to generate radiation having a wavelength ranging between about 1 nm and about 300 nm in some embodiments. In one particular example, the high-brightness light source 11 generates an EUV light with a wavelength centered at about 13.5 nm. Accordingly, the high-brightness light source 11 is also referred to as an EUV light source in some embodiments. However, it should be appreciated that the high-brightness light source 11 should not be limited to emitting EUV light. The high-brightness light source 11 can be the light sources including deep UV, such as an ArF or KrF laser. In other embodiments, the system is a e-beam mask/wafer drawing system.

In various embodiments, the illuminator 12 includes various reflective optics in order to direct light from the high-brightness light source 11 onto a mask stage 13, particularly to the mask 14 secured on the mask stage 13. The mask stage 13 is configured to secure the mask 14. In some embodiments, the mask stage 13 includes an electrostatic chuck (e-chuck) to secure the mask 14. Since gas molecules absorb EUV light, the lithography system for the EUV lithography patterning is maintained in a vacuum environment to avoid EUV intensity loss. In the present disclosure, the terms mask, photomask, and reticle are used interchangeably.

In the present embodiment, the mask 14 is a reflective mask. One exemplary structure of the mask 14 includes a substrate with a suitable material, such as a low thermal expansion material (LTEM) or fused quartz. In various examples, the LTEM includes $TiO_2$ doped $SiO_2$, or other suitable materials with low thermal expansion. The mask 14 includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 14 may further include a capping layer, such as ruthenium (Ru), disposed on the ML for protection. The mask 14 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The projection optics module (or projection optics box (POB)) 15 is configured for imaging the pattern of the mask 14 onto a semiconductor wafer 5 secured on the wafer stage 16 of the processing apparatus 10. In some embodiments, the POB 15 has refractive optics (such as for a UV lithography system) or alternatively reflective optics (such as for an EUV lithography system) in various embodiments. The light directed from the mask 14, carrying the image of the pattern defined on the mask, is collected by the POB 15. The illuminator 12 and the POB 15 are collectively referred to as an optical module of the processing apparatus 10.

The wafer transfer system 17 is configured to deliver the semiconductor wafer 5 from one location within the processing apparatus 10 to another location. For example, the semiconductor wafer 5 located in a load lock chamber is transferred to the wafer stage 16 by the wafer transfer system 17. A radial and rotational movement of the wafer transfer system 17 can be coordinated or combined in order to pick up, transfer, and deliver the semiconductor wafer 5.

In the present embodiment, the semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 5 may be a silicon-on-insulator (SOI) or a germanium-on-insulator (GOI) substrate.

In addition, the semiconductor wafer 5 may have various device elements. Examples of device elements that are formed or to be formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, EUV lithography, annealing, and/or other suitable processes.

In some embodiments, the semiconductor wafer 5 is coated with a resist layer that is sensitive to the EUV light. Various components including those described above are integrated together and are operable to perform lithography exposing processes.

Figure 2A:
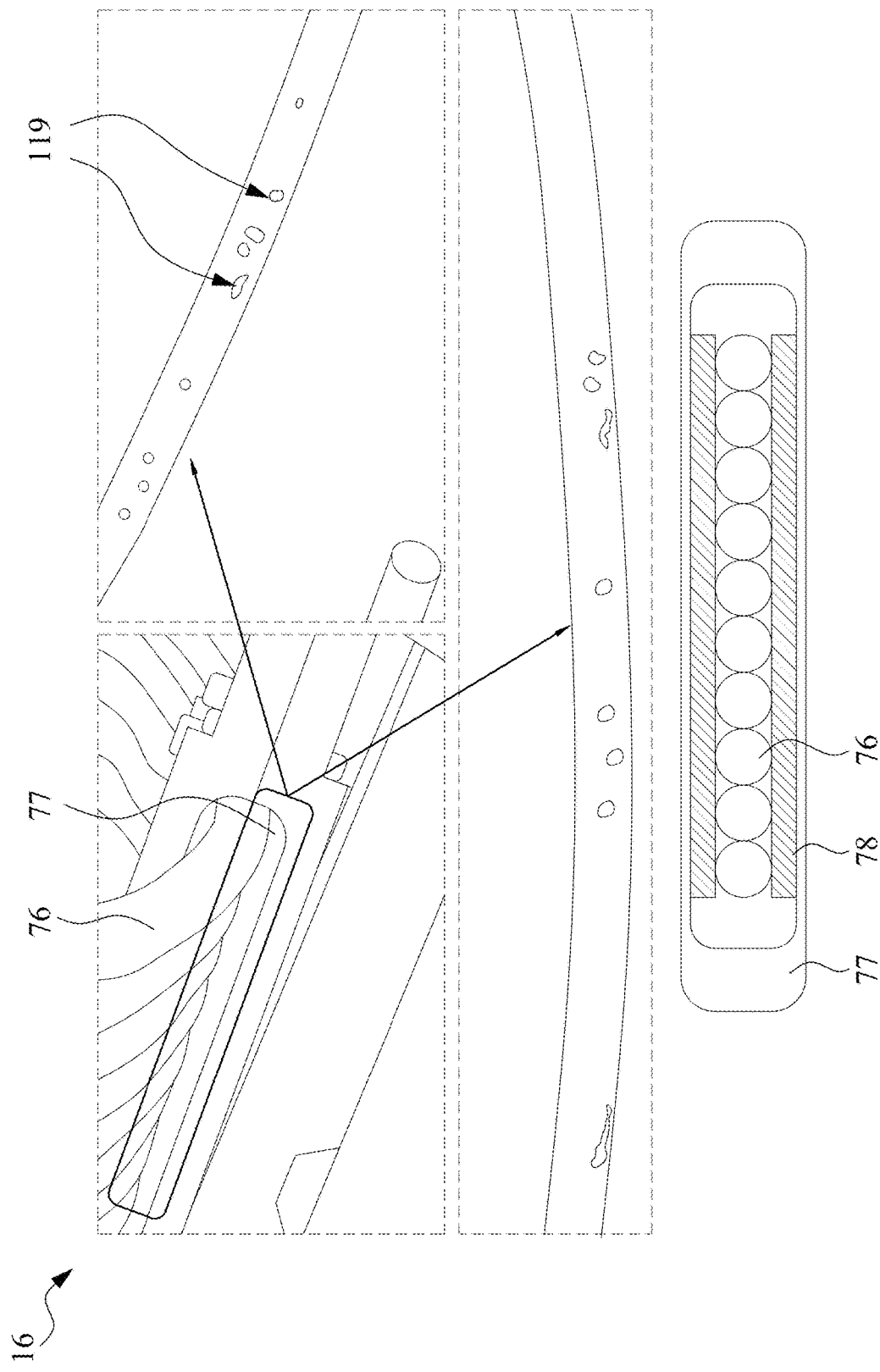
FIGS. 2A and 2B show images of a wafer stage used for a semiconductor wafer process according to an embodiment of the disclosure.
Figure 2B:
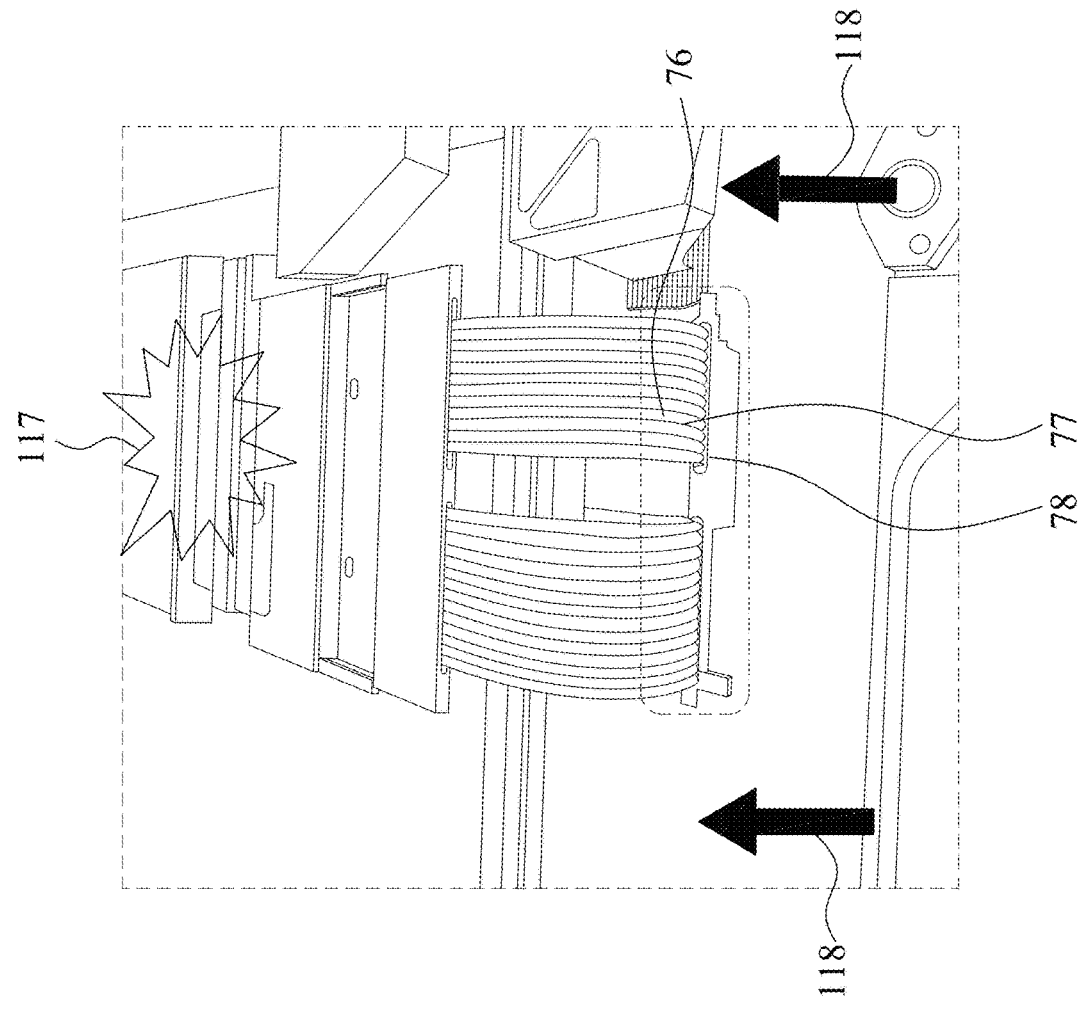

FIGS. 2A and 2B show images of parts of a wafer stage used for the semiconductor manufacturing process according to an embodiment of the disclosure. A cable or a plurality of cables 76 are connected to the wafer stage 16 through a raceway/trough 77. When the cable is arranged to be pulled through the raceway/trough 77 and bent frequently to move the wafer stage, bending portions of the cable may be in direct contact with the edge of the raceway/trough 77. Due to frequent wafer stage transportation to perform lithography measuring/exposing processes, debris particles may be generated from the contact area 78 between the cable 76 and the edge of the raceway/trough 77. An upward flow 118 of cleaning gas by the turbomolecular pumps may cause the debris particles to fly and land on, for example, a particle landing area 117.

Figure 2C:
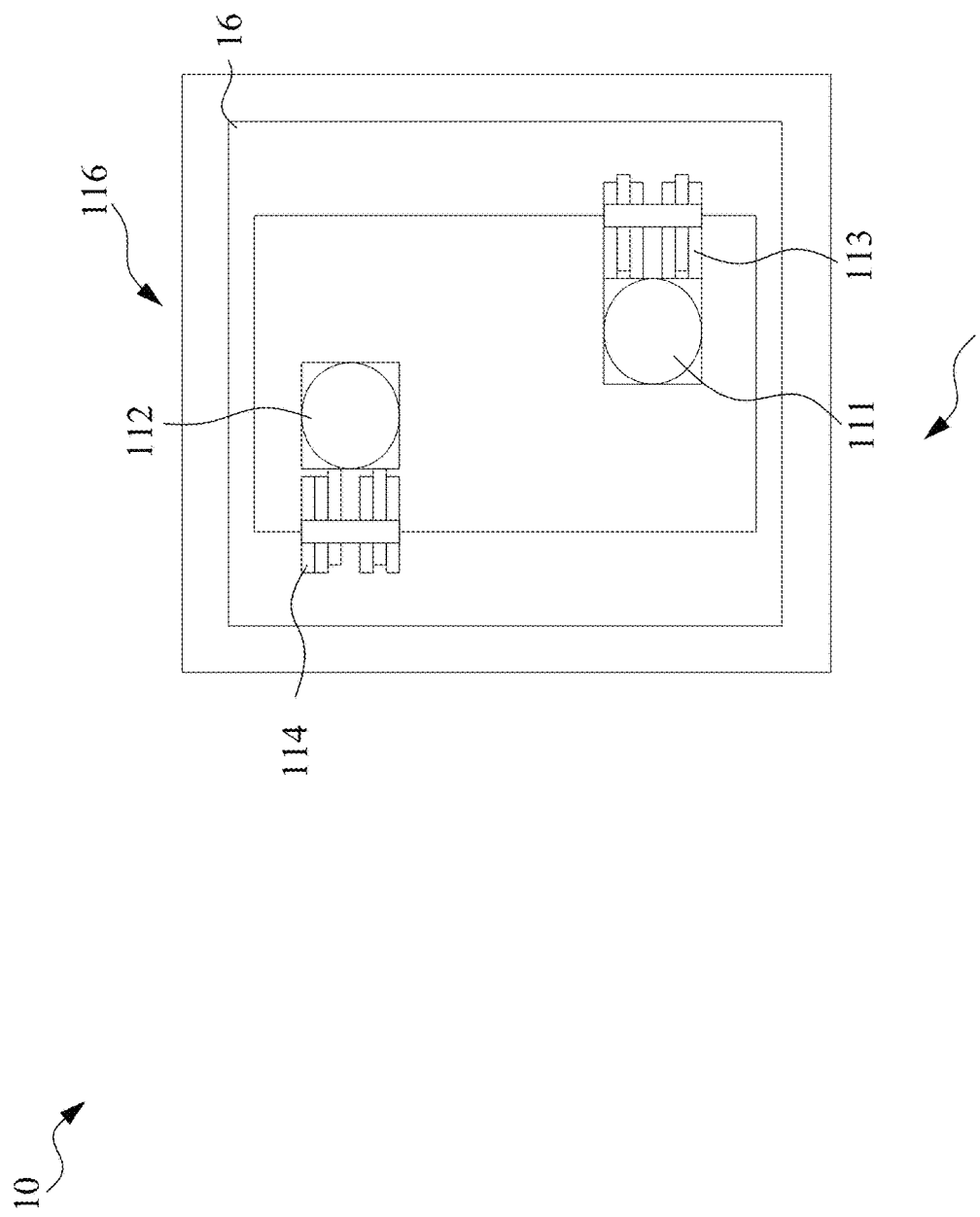
FIG. 2C schematically shows a wafer stage including two wafer chucks to simultaneously perform exposure and measurement operations according to an embodiment of the disclosure.

FIG. 2C schematically shows a wafer stage 16 used for the semiconductor manufacturing process according to an embodiment of the disclosure. In the processing apparatus 10 according to the present disclosure, first and second wafer chucks 113 and 114 are arranged on the wafer stage 16. The wafer stage 16 is arranged to simultaneously perform various measurement operations onto a first wafer 111 mounted on the first wafer chuck 113 at a measurement side 115 of the wafer stage 16 and an exposure operation onto a second wafer 112 mounted on the second wafer chuck 114 at an exposure side 116 of the wafer stage 16. For example, the first wafer 111 on the first wafer chuck 113 can go through alignment and/or focus measurement operations at the measurement side 115. After the first wafer chuck 113 is completed the measurement, operations can be transferred to an exposure position at the exposure side 116 of the wafer stage 16. The exposure operation onto the first wafer 111 can be performed simultaneously in parallel with the measurement operation onto the second wafer 112 next in the sequence. This makes it possible to simultaneously perform exposure and measurement by operation of the wafer stage 16 and to implement a high-speed exposure apparatus.

Figure 2D:
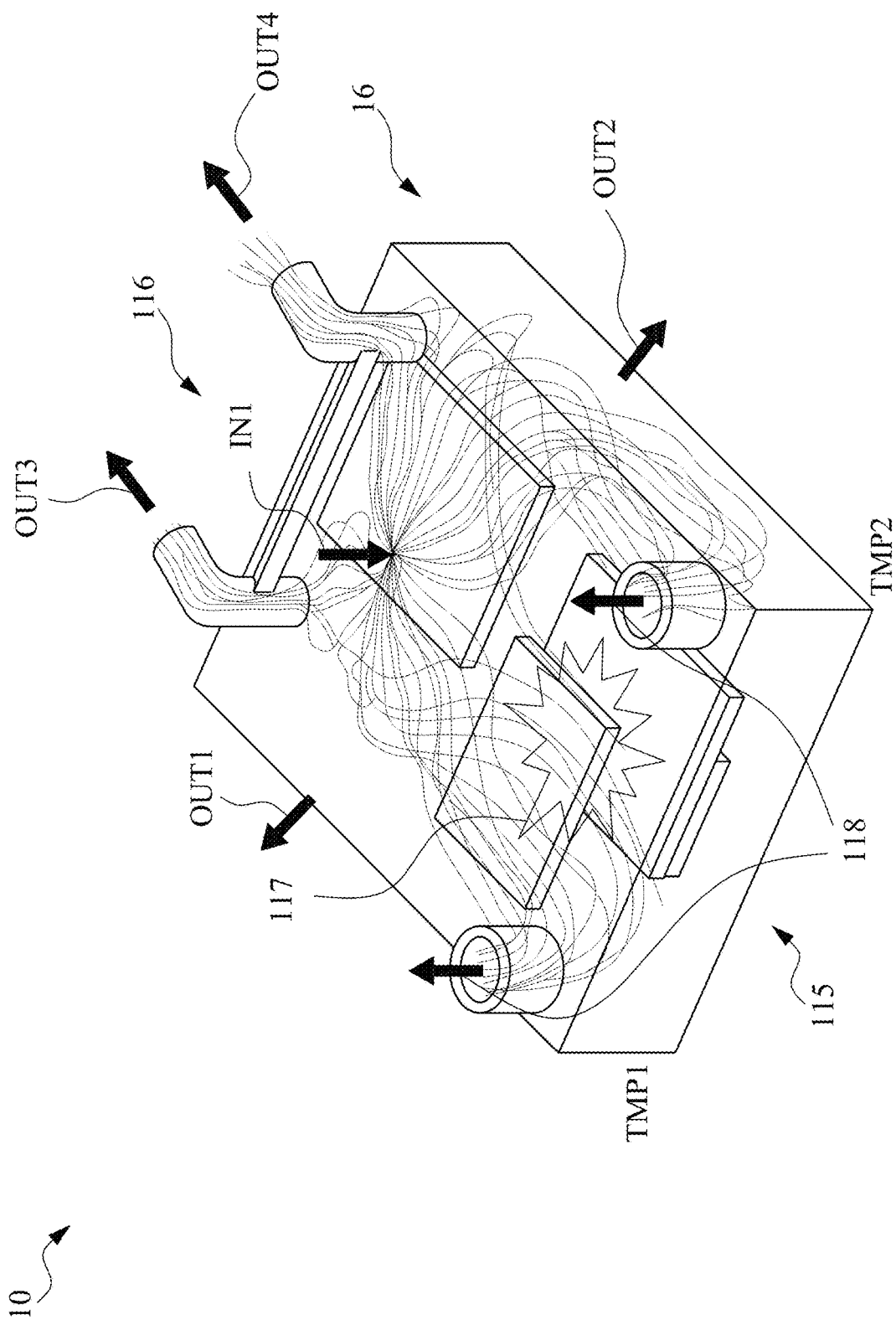
FIG. 2D schematically illustrates an exhaust flow around the wafer stage in a processing apparatus.

FIG. 2D schematically illustrates an exhaust flow around the wafer stage 16 in the processing apparatus. In some embodiments, the controller of the processing apparatus 10 regulates the flow of cleaning gas to maintain the inner pressure value constant during a normal EUV exposure operation. In some embodiments, the turbomolecular pumps TMP1, TMP2 are coupled to an inlet/exhaust port to the wafer stage 16. In such a case, the debris particles generated from the contact area between the cable may be disturbed by the outflow of cleaning gas by the turbomolecular pumps TMP1, TMP2 and result in a turbulent flow of the cleaning gas within the processing apparatus 10. Then the debris particles generated from the edge of the raceway/trough may be accumulated in, for example, the particle landing area 117 in the measurement side 115 of the wafer stage 16, due to an upward flow 118 of cleaning gas by the turbomolecular pumps TMP1, TMP2. Such a turbulent flow has the potential for not only disturbing the outflow of the debris particles 119 from the measurement side 115 to the exposure side 116 of the wafer stage 16 where exhaust ports OUT1, OUT2, OUT3, OUT4 are located, but also resulting in a contamination deposited on the particle landing area 117 in a measurement side 115 of the wafer stage 16 over a period of time. In some cases, the debris particles 119 generated from the contact area between the cable and the edge of the raceway/trough fall and are accumulated on the wafer when the wafer is in the measurement side 115 of the wafer stage 16.

Figure 3A:
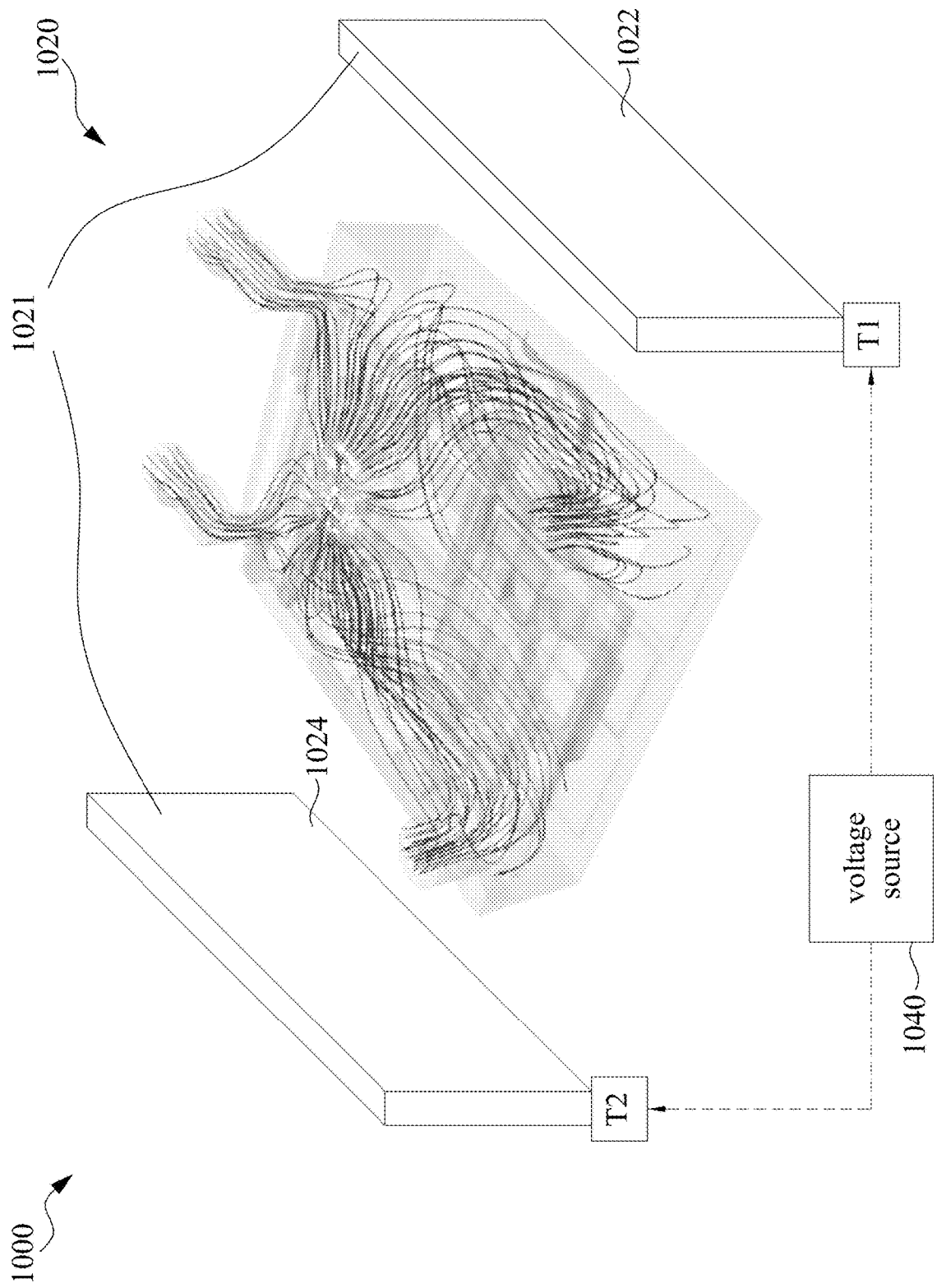
FIG. 3A shows a particle removing assembly including particle removing electrodes according to an embodiment of the disclosure.

Referring to FIG. 3A, a particle removing assembly 1000 according to the present embodiment includes particle removing electrodes 1020. In some embodiments, the particle removing electrodes 1020 includes a pair of particle removing electrodes 1021 having first electrode 1022 and second electrode 1024. A voltage source 1040 is connected to the pair of particle removing electrodes 1021 via first terminal T1 and second terminal T2. In some embodiments, the voltage source 1040 is an alternating current (AC) voltage source 1040 that is configured to provide AC voltage to the pair of particle removing electrodes 1021. In some embodiments, the application of the AC voltage from the AC voltage source 1040 to the particle removing electrodes 1020 makes the debris particles 119 on and/or in proximity of the surface of the particle removing electrodes 1020. In some embodiments, an amplitude of the applied AC voltage ranges from about 9,000 volts to about 11,000 volts among 1 volt, 2 volt, 5 volt, 10 volt, 20 volt, 50 volt, 100 volt, 200 volt, 500 volt, 1000 volt, 2000 volt, 5000 volt, and 10,000 volt inclusive of any combination of voltages therebetween. In some embodiments, a frequency of the applied AC voltage ranges from about 1 Hz to about 100 Hz among 1 Hz, 2 Hz, 5 Hz, 10 Hz, 20 Hz, 50 Hz, 100 Hz, 200 Hz, 500 Hz and 1000 Hz inclusive of any combination of frequencies therebetween.

Figure 3B:
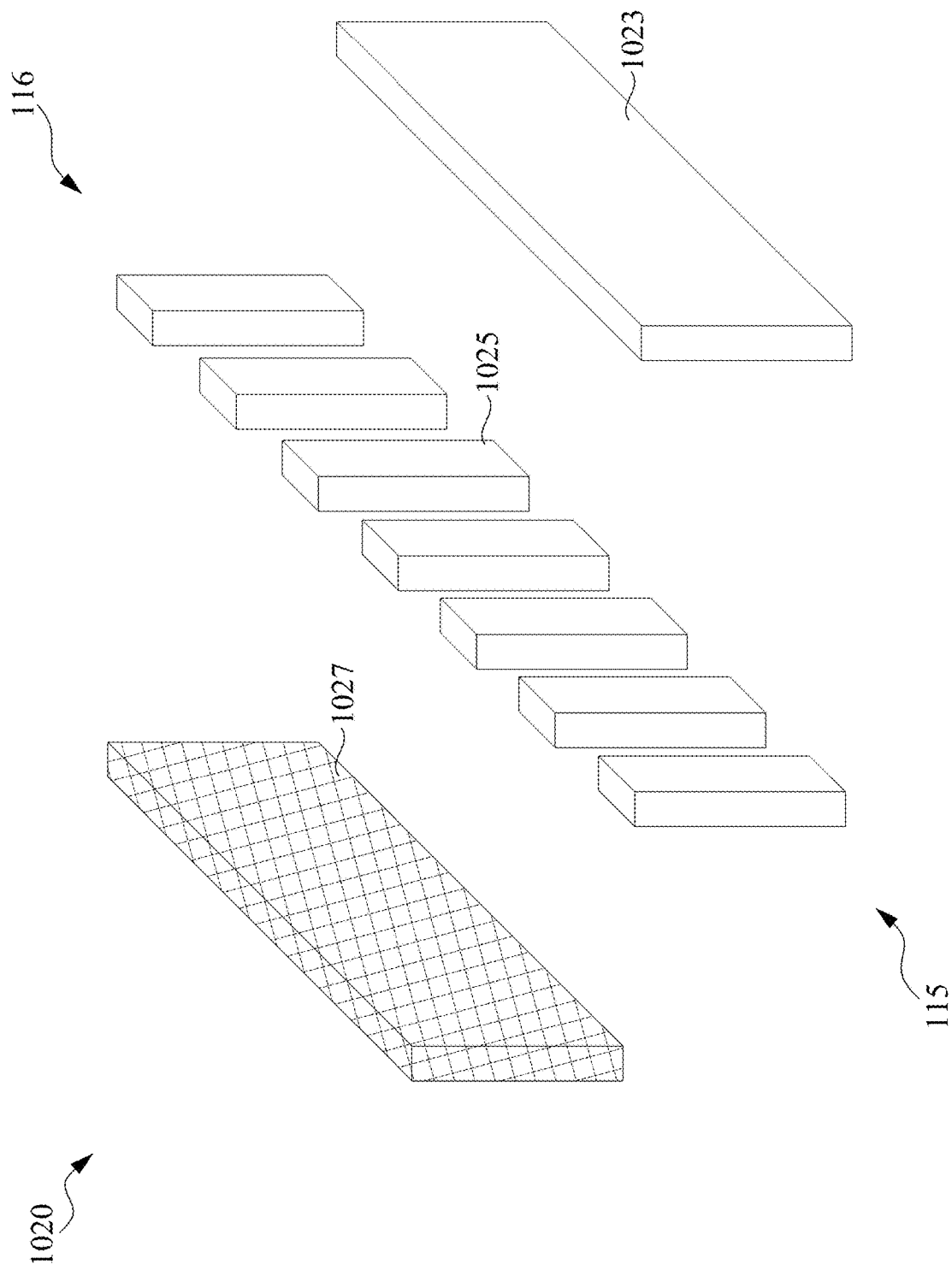
FIG. 3B shows a schematic view of various types of a particle removing electrode.

As shown in FIG. 3B, the particle removing electrodes 1020 may be constructed in various forms and/or shapes of different electrical and physical properties for the purpose of achieving desired properties and performance. In some embodiments, the particle removing electrodes 1020 forms an elongated plate structure 1023 extending from the measurement side 115 to the exposure side 116 of the wafer stage 16. In a particular embodiment, the particle removing electrodes 1020 is a solid plate about 3 meters in length, about 0.5 meter in height, and about 10 millimeters in thickness. In some embodiments, the length of the solid plates ranges about 0.1 meter, 0.2 meter, 0.5 meter, 1 meter, 2 meter, and 5 meter inclusive of any combination of length therebetween. In some embodiments, the height of the solid plates ranges about 0.1 meter, 0.2 meter, 1 meter, 2 meter, and 5 meter inclusive of any combination of height therebetween. In some embodiments, the thickness of the solid plates ranges about 1 mm, 2 mm, 5 mm, 10 mm, 20 mm, and 50 mm inclusive of any combination of length therebetween. In some embodiments, the particle removing electrodes 1020 includes an array of electrodes 1025 spaced apart within the first electrode and the second electrode, respectively. In some embodiments, the particle removing electrodes 1020 form a mesh structure 1027. In some embodiments, the mesh structure has an opening in a center region of a shape such as for example, a donut shape. In some embodiments, the particle removing electrodes 1020 is fixedly attached to the processing apparatus adjacent to the wafer stage. In some embodiments, the particle removing electrodes 1020 is a thin metal strip which extends along the wafer stage 16. In some embodiments, the first electrode 1022 and the second electrode 1024 are arranged using a metallized paint.

Figure 3C:
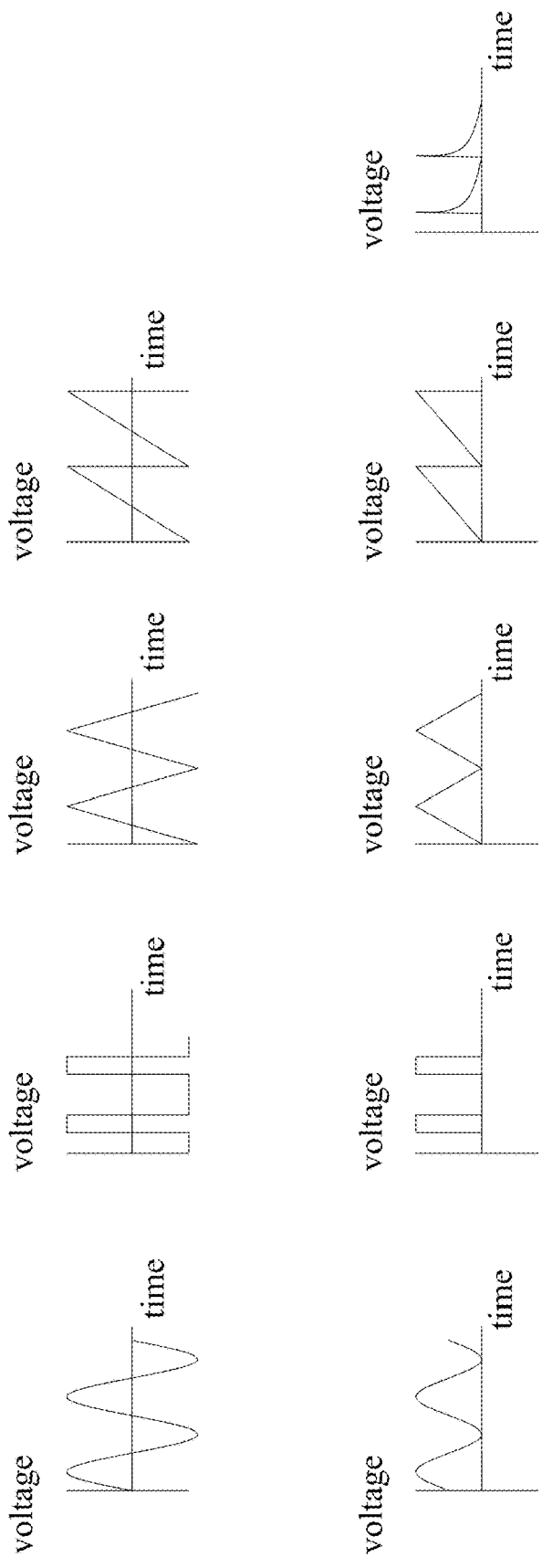
FIG. 3C shows a schematic view of various voltage wave forms in a time varying voltage source of a particle removing electrode.

In some embodiments, the voltage source 1040 is a time varying voltage source. As shown in FIG. 3C, the time varying voltage source provides a voltage with various wave forms selected from a group consisting of a sinusoidally-shaped wave, a square-shaped wave, a triangular-shaped wave, a saw-tooth shaped wave, and other desired wave shapes. The voltage source 1040 may repeat the selected wave form at a constant frequency and/or pulse at a selected duty-cycle, including ultra-short pulse width (nanosecond range) or modulate the wave form using amplitude modulation (AM), frequency modulation (FM), or pulse width modulation (PWM) and/or other types of modulation. In some embodiments, the voltage source 1040 includes a positive or negative direct current (DC) voltage bias to the time varying voltage.

In some embodiments, the voltage source 1040 is radio frequency (RF) power supply. The duty ratio (on-to-off ratio) of the radio frequency (RF) power ranges from about 10% to about 90%. In some embodiments, a frequency of the RF power ranges from about 1 Hz to about 1000 Hz among 1 Hz, 2 Hz, 5 Hz, 10 Hz, 20 Hz, 50 Hz, and 100 Hz inclusive of any combination of frequencies therebetween. In other embodiments, a frequency of the RF power ranges from about 1 kHz to about 100 kHz among 1 kHz, 2 kHz, 5 kHz, 10 kHz, 20 kHz, 50 kHz, and 100 kHz inclusive of any combination of frequencies therebetween. In certain embodiments, a frequency of the RF power ranges from about 1 GHz to about 10 GHz among 1 GHz, 2 GHz, 5 GHz, and 10 GHz inclusive of any combination of frequencies therebetween. In particular embodiments, the frequency of the RF power is 13.56 MHz, 2.56 GHz or any other suitable frequencies used in the semiconductor industries. The application of the AC power creates the charged surface on the surface of the particle removing electrodes 1020. In some embodiments, the application of the AC voltage occurs for a duration of about 1 second to about 1,000 seconds among 1 second, 2 second, 5 second, 10 second, 20 second, 50 second, 100 second, 200 second, 500 second and 1000 second inclusive of any combination of time therebetween.

In some embodiments, a bias voltage can be provided as a pulsed voltage having a duty ratio in a range from about 10% to about 90%. In some embodiments, a unit cycle (one "on" period and one "off" period) is in a range from about 0.5 sec to 10 sec, and is in a range from about 1 sec to 5 sec. In some embodiments, the pulsed-bias is a repetition of applying voltage operations.

Figure 3D:
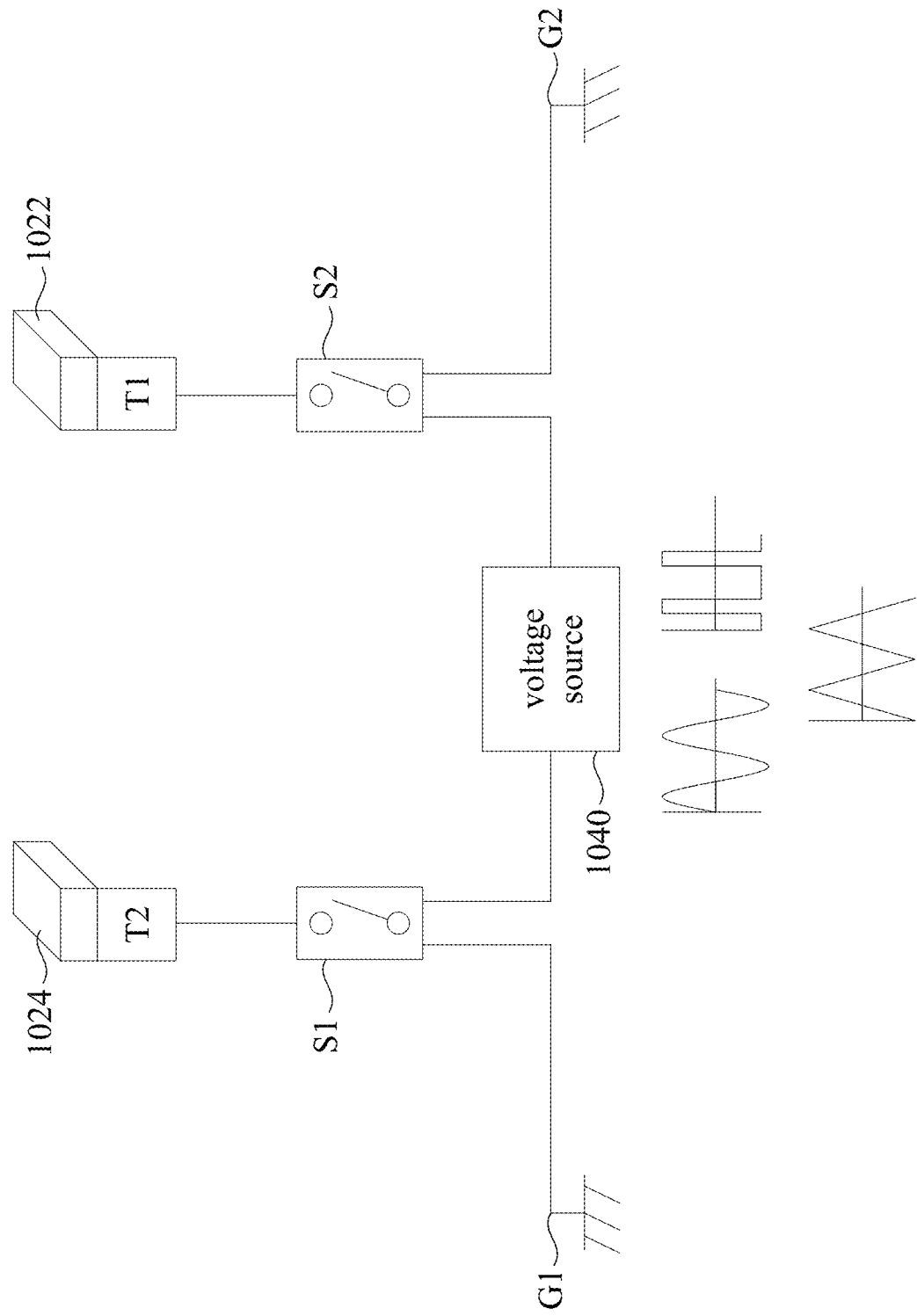
FIG. 3D shows a schematic view of various connection schemes of a particle removing electrode.

As shown in FIG. 3D, in some embodiments, the voltage source 1040 may be connected to the first electrode 1022 (via the first terminal T1) and the second electrode 1024 (via the second terminal T2) therebetween. In some embodiments, switches S1, S2 may be used to connect the voltage source 1040, the first electrode 1022 (via the first terminal T1), and the second electrode 1024 (via the second terminal T2). In some embodiments, the voltage source 1040 is connected to the first electrode 1022 and the second electrode 1024 is connected to the ground or a zero voltage reference G1, G2. In some embodiments, the voltage source 1040 is connected to the second electrode 1024 and the first electrode 1022 is connected to a ground circuit, an earth ground or a zero voltage reference G1, G2.

Figure 3E:
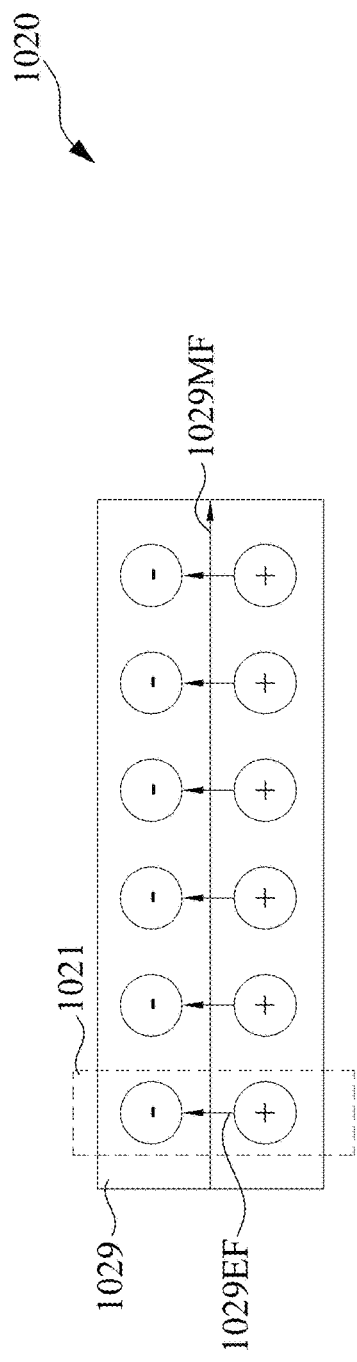
FIGS. 3E, 3F, and 3G shows a schematic view of a plurality of pairs of electrodes generating electric and magnetic fields according to an embodiment of the disclosure.
Figure 3F:
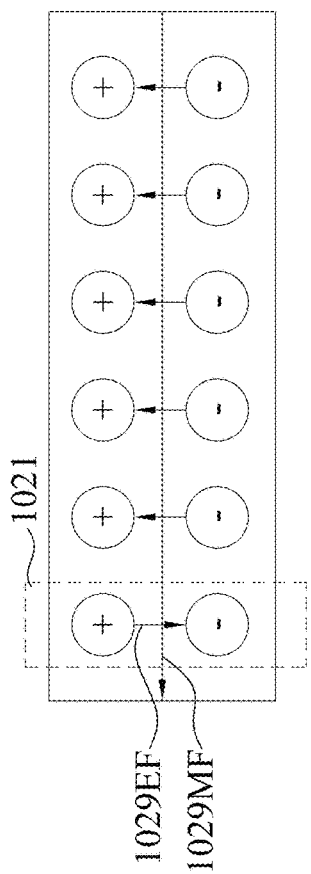
Figure 3G:
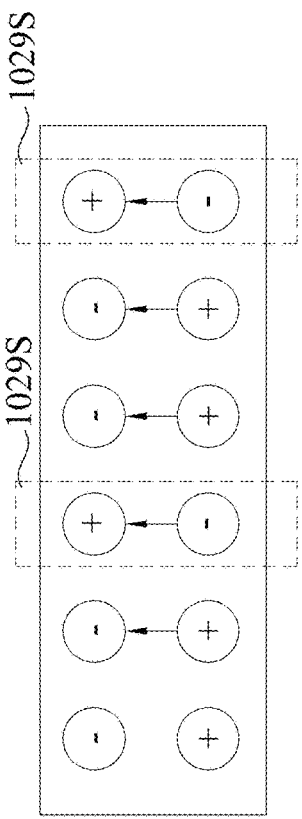

As shown in FIGS. 3E-3G, in some embodiments, the particle removing electrodes 1020 includes a plurality of pairs of electrodes 1029 in an array. The plurality of pairs of electrodes 1029 may be embedded with the pair of particle removing electrodes 1021 affixed or attached thereto. In some embodiments, the plurality of pairs of electrodes 1029 include the pair of particle removing electrodes 1021 equally spaced apart therebetween. In some embodiments, the plurality of pairs of electrodes 1029 include the pair of particle removing electrodes 1021 arranged in a pattern having an unequal spacing therebetween. As shown in FIG. 3E, when an alternating voltage is applied between the plurality of pairs of electrodes 1029, in some embodiments, an electric field is generated in a direction 1029EF and a magnetic field is generated in a direction 1029MF. As shown in FIG. 3F, in some embodiments, another electric field 1029EF and another magnetic field 1029 MF may be generated in an opposite direction. In some embodiments, the plurality of pairs of electrodes 1029 are provided with the same voltages. In some embodiments, the plurality of pairs of electrodes 1029 are applied with various voltages from a plurality of voltage sources for selected electrodes 1029S. In some embodiments, the voltage in a desired form or forms may be selectively applied to pairs of particle removing electrodes in the plurality of pairs of electrodes 1029. In some embodiments, the voltage in a desired form or forms may be sequentially applied to select pairs of the particle removing electrodes.

Figure 4B:
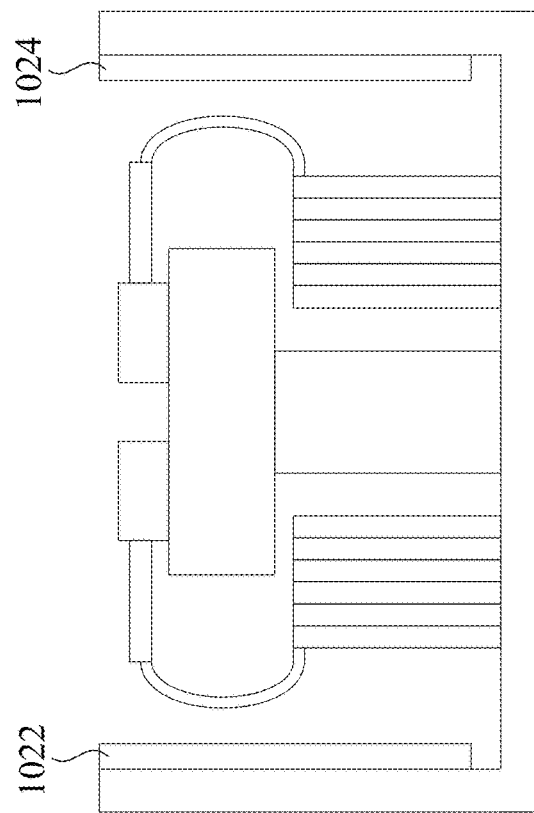
FIGS. 4A and 4B show detailed views of a particle removing assembly in a processing apparatus according to an embodiment of the disclosure.
Figure 4A:
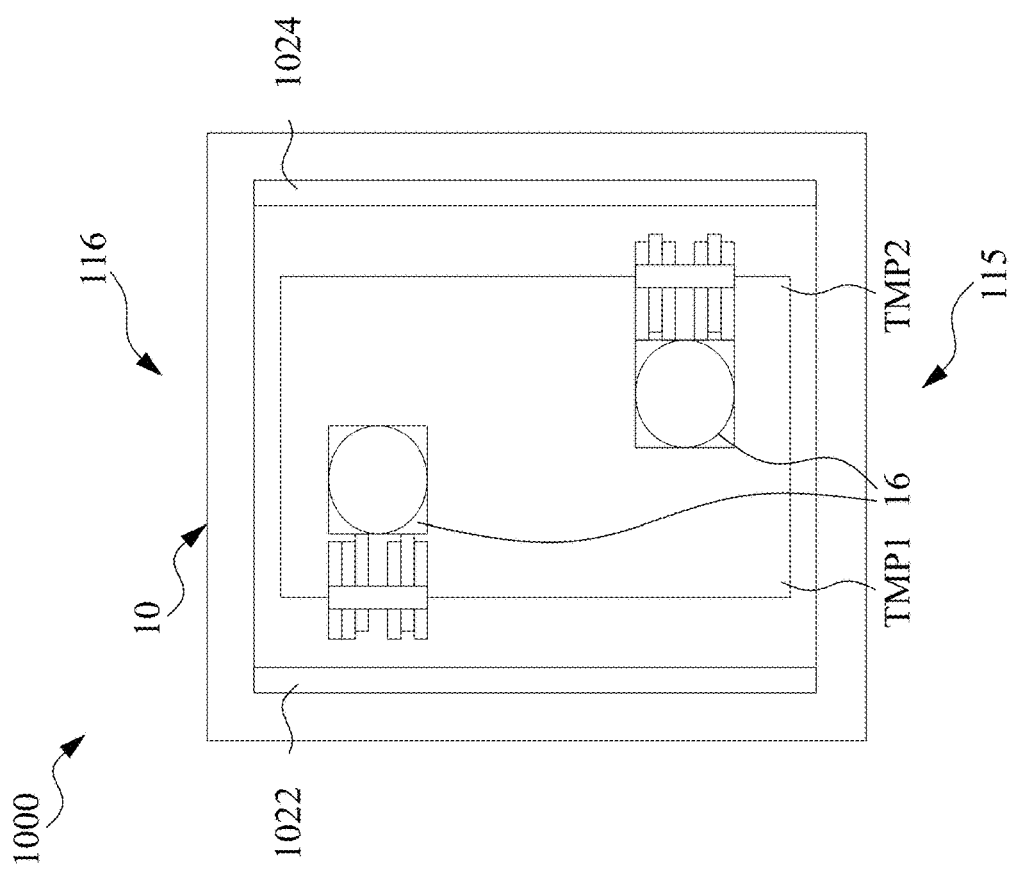

FIGS. 4A and 4B show detailed views of the particle removing assembly 1000 in a processing apparatus according to an embodiment of the disclosure. As shown in FIGS. 4A and 4B, the particle removing assembly 1000 according to the present disclosure includes the first electrode 1022 arranged in a first side of the processing apparatus 10 adjacent to the wafer stage 16 to provide an electric field. In some embodiments, the particle removing assembly 1000 further includes a second electrode 1024 arranged in a second side of the processing apparatus 10 adjacent to the wafer stage 16. In some embodiments, the debris particles 119 are caught by the first electrode 1022 and the second electrode 1024. In some embodiments, the first electrode 1022 and the second electrode 1024 guides the debris particles 119 along the electric field 1029EF and discharge the debris particles 119 to the exhaust ports OUT1, OUT2, OUT3, OUT4 shown in FIG. 2D.

Figure 4C:
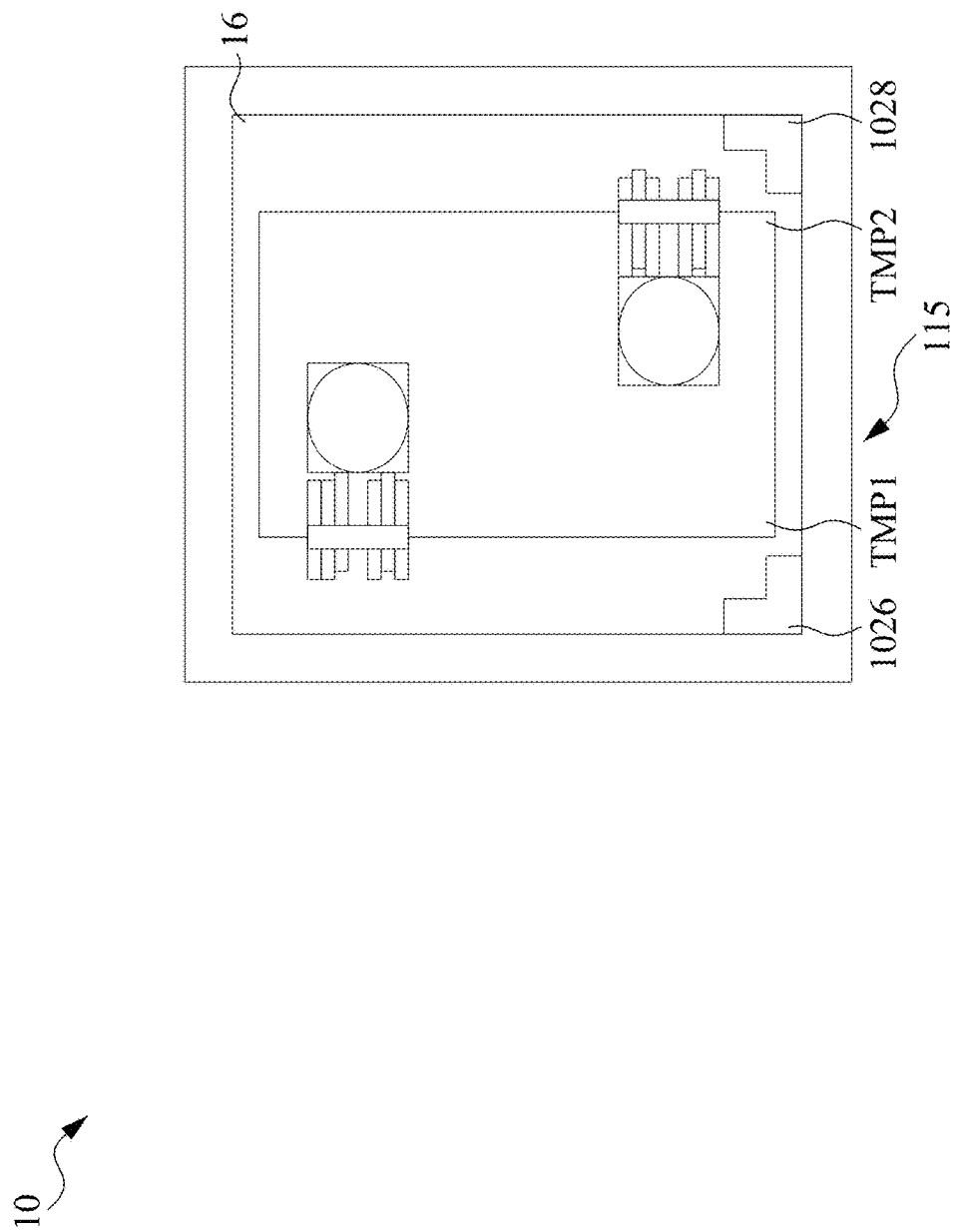
FIG. 4C shows a schematic view of various type of particle removing electrodes according to an embodiment of the disclosure.

As shown in FIG. 4C, in some embodiments, the particle removing assembly 1000 according to the present disclosure further includes first and second corner electrodes 1026, 1028. The first and second electrodes 1026, 1028 are configured to remove the debris particles 119 near the particle landing area 117 in the measurement side 115 of the wafer stage 16, due to an upward flow 118 of cleaning gas by the turbomolecular pumps TMP1, TMP2. The first corner electrode 1026 is arranged in a first corner side of the processing apparatus 10, which is adjacent to the turbomolecular pumps TMP1 located at the corner of the wafer stage 16 to provide an electric field in the measurement side 115. In some embodiments, the second corner electrode 1028 is arranged in a second corner side of the processing apparatus 10, which is adjacent to the turbomolecular pumps TMP2 located at the corner of the wafer stage 16 to provide an electric field in the measurement side 115.

Figure 5:
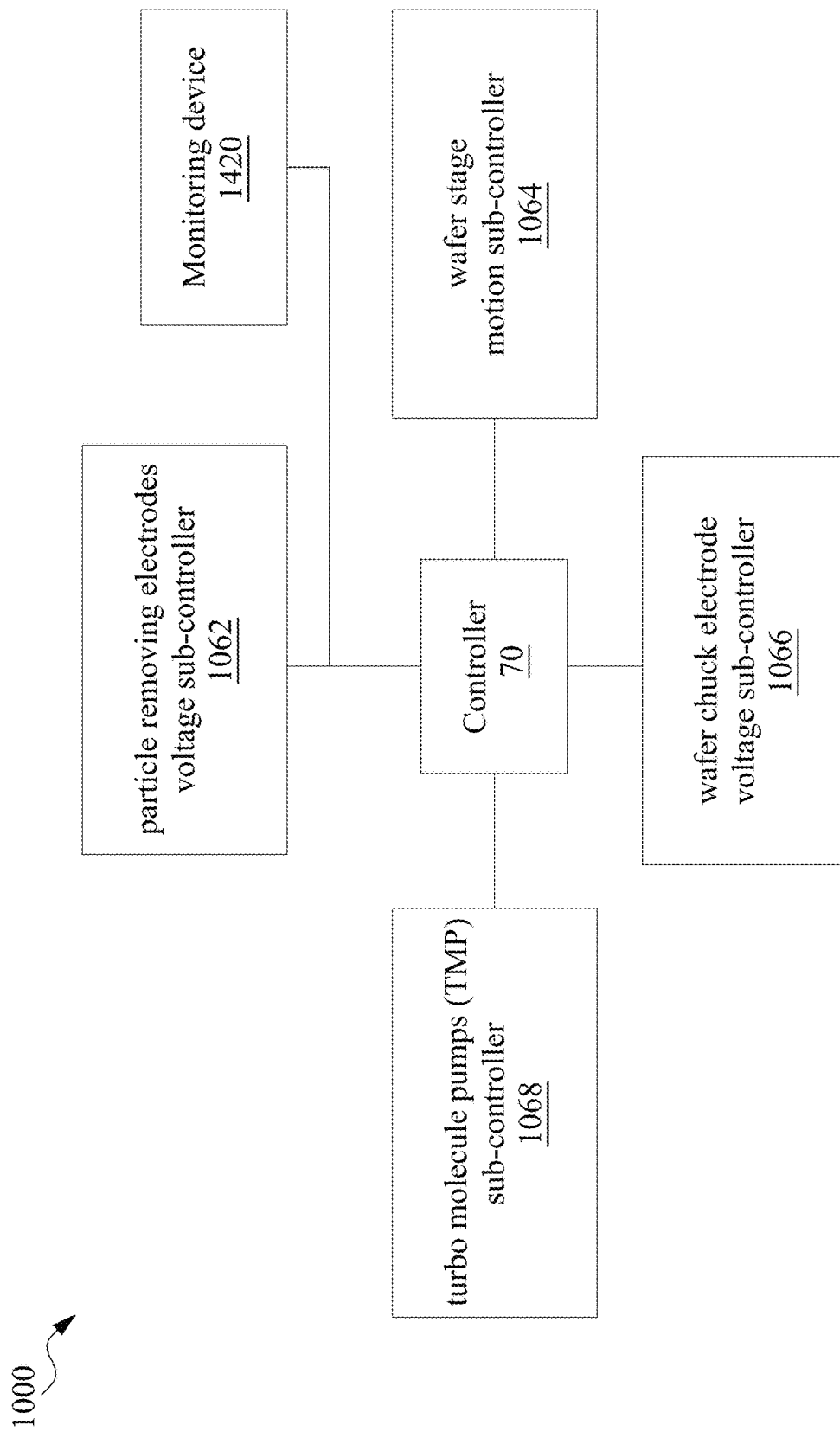
FIG. 5 shows various sub-controllers for removing debris particles according to an embodiment of the disclosure.

FIG. 5 shows a control system with various sub-controllers 1060 for removing debris particles according to an embodiment of the disclosure. In some embodiments, the particle removing assembly 1000 includes a particle removing electrodes voltage sub-controller 1062 and a monitoring device 1420. Typically, the controller 70 of the EUV lithography system is operatively in communication with a wafer stage motion sub-controller 1064 and a wafer chuck electrodes voltage sub-controller 1066 and turbomolecular pump (TMP) sub-controller 1068. The particle removing electrodes voltage sub-controller 1062 communicates with the wafer stage motion sub-controller 1064, the wafer chuck electrodes voltage sub-controller 1066, and the TMP sub-controller 1068 through the controller 70. In some embodiments, the particle removing electrodes voltage sub-controller 1062 is in communication with the controller 70 to control the flow rate of the exhaust gas. The particle removing assembly 1000 is configured to remove the debris from the processing apparatus with improved techniques minimizing the turbulence surrounding the wafer stage. The combination of the controlling the turbomolecular pumps TMP1, TMP2, adjusting the voltages supplied to the particle removing electrodes 1020 and/or electrodes in the electrostatic chuck 130, and exhausting process through exhaust ports OUT1, OUT2, OUT3, OUT4 enhances the efficiency of the particles removal.

In some embodiments, the controller 70 is configured to monitor debris particles 119 on the wafer by the monitoring device 1420 and adjust valves of the pumps when an amount of debris particles 119 in the wafer is more than a threshold amount or greater than a threshold size. In some embodiments, the monitoring device is a camera. Any appropriate controlling configuration regarding automatic and/or manual operation is contemplated and is not limited in this regard. In some embodiments, the cleaning position of the particle removing electrodes with respect to the surface on the wafer 5 is programmed by the controller 70 according to different cleaning modes.

Figure 6:
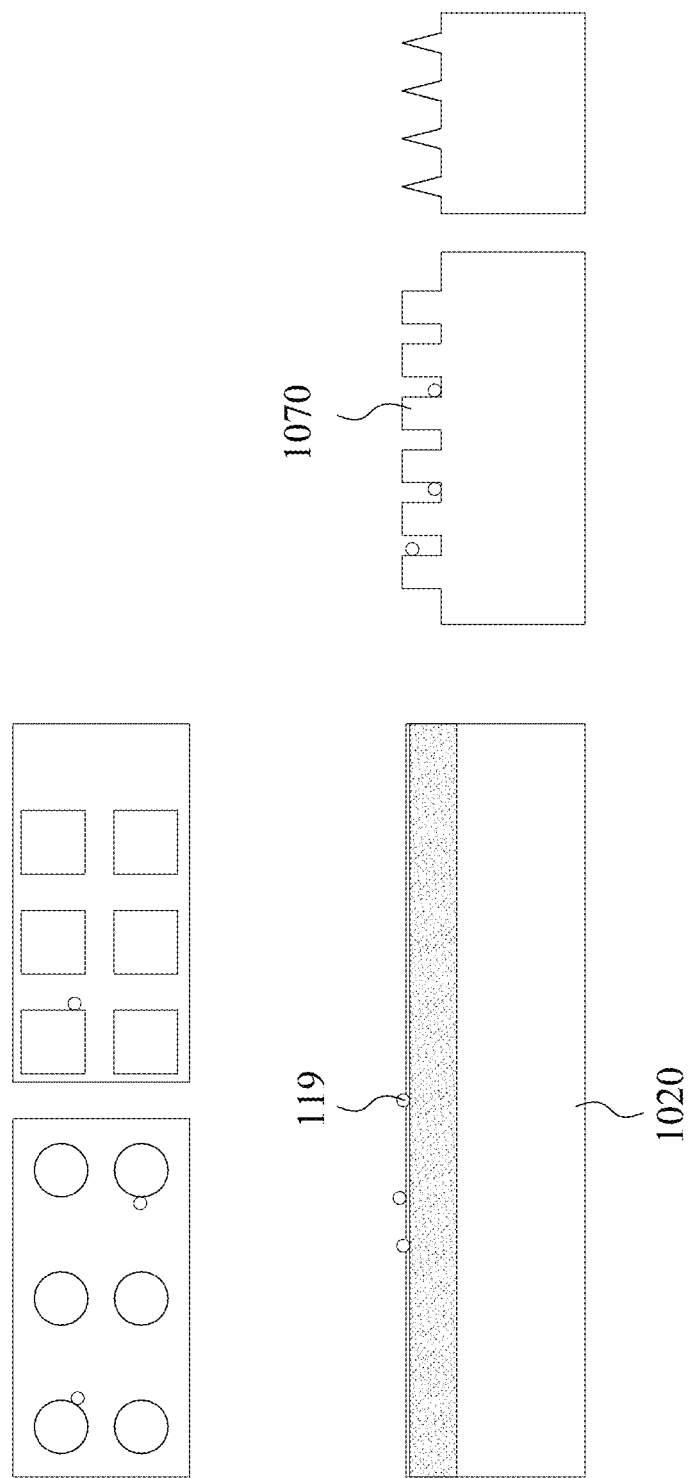
FIG. 6 shows a detailed view of particle removing electrodes including regularly and/or irregularly formed nanostructures according to the present disclosure.

As shown in FIG. 6, in some embodiments, surface of the particle removing electrodes 1020 has regularly and/or irregularly formed nano-structures 1070 to trap contaminants and/or debris particles 119 to improve performance removing such contaminants and/or debris particles to improve cleanliness of semiconductor wafer process. In some embodiments, the particle removing electrodes 1020 is made of one of Au/Ti, TiN, CrN, Al, or a combination thereof, and the like. In some embodiments, the surface of the particle removing electrodes 1020 includes protrusions, each of which diameter is in a range from about 0.1 μm to about 1 mm. In some embodiments, the diameter is in a range between any of the following diameters: 0.1 μm, 0.2 μm, 0.5 μm, 1 μm, 2 μm, 5 μm, 10 μm, 20 μm, 50 μm, 100 μm, 200 μm, 500 μm and 1 mm. The height of the protrusions is in a range from about 0.1 μm to about 1 mm in some embodiments. The protrusions may have a columnar, a pyramidal or conical shape. The nano-structures 1070 may be formed by a sand blast method, a wet etching method using an acid or alkaline solution, an ion bombardment method or a plasma etching method. In some embodiments, the particle removing electrodes 1020 has an irregularly or regularly roughened surface. The arithmetic average surface roughness Ra of the roughened surface is in a range from about 0.1 μm to about 1 mm in some embodiments. In some embodiments, the arithmetic average surface roughness Ra of the roughened surface is in a range between any of the following surface roughness Ra: 0.1 μm, 0.2 μm, 0.5 μm, 1 μm, 2 μm, 5 μm, 10 μm, 20 μm, 50 μm, 100 μm, 200 μm, 500 μm and 1 mm.

Figure 7:
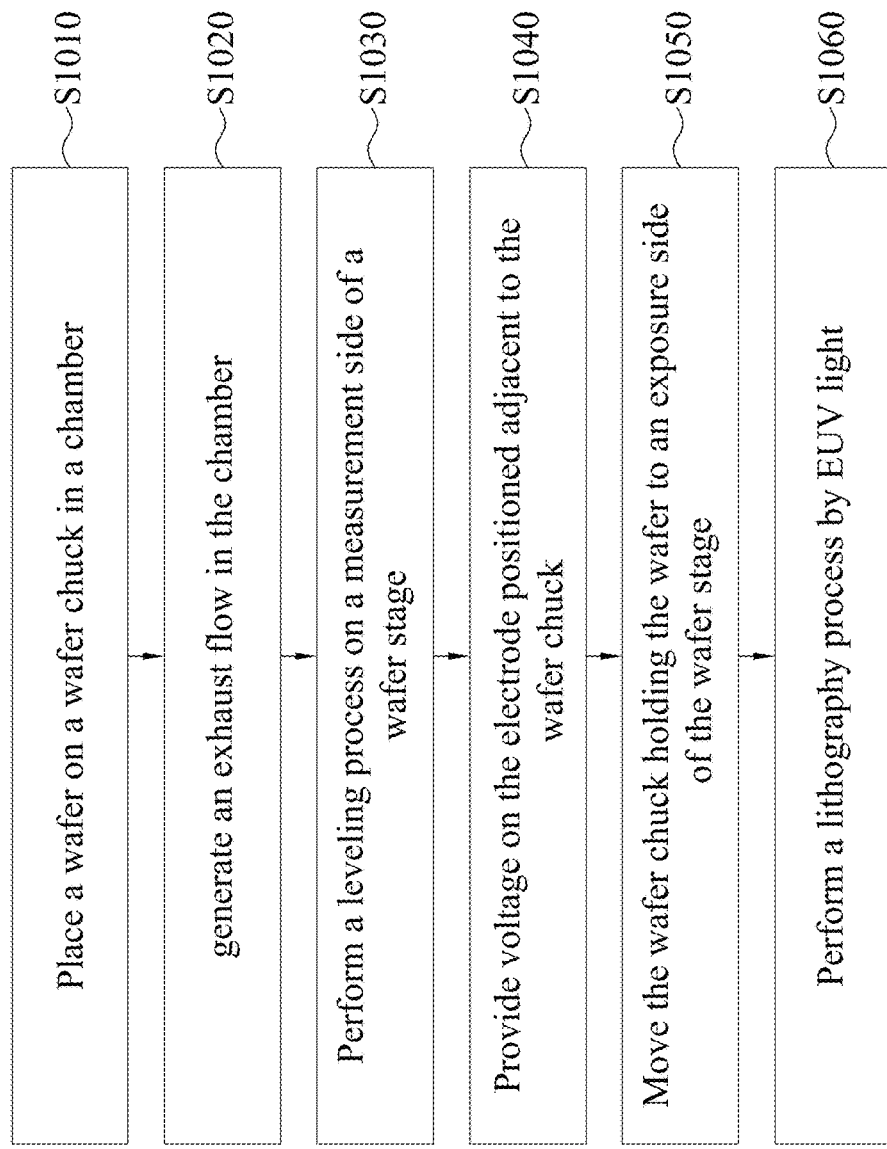
FIG. 7 illustrates a flow chart of a method of controlling the particle removing assembly in accordance with an embodiment of the present disclosure.

FIG. 7 illustrates a flow chart of a method 1000 of controlling the particle removing assembly 1000 in accordance with an embodiment of the present disclosure. The method includes, at S1010, placing a wafer on a wafer chuck in a chamber. Then, the method includes, at S1020, generating an exhaust flow in the chamber. The exhaust operation begins so that the debris can be exhausted smoothly from the wafer stage 16 in the processing apparatus 10 through the exhaust ports OUT1, OUT2, OUT3, OUT4 as shown in FIG. 2D.

When the exhaust flow is generated, a leveling process is performed on a measurement side 115 of the wafer stage 16 at S1030. In some embodiments, the leveling process adjusts the flatness of the wafer and/or an exposure area on the wafer using sensors so that wafer/exposure is positioned substantially perpendicular to an optical axis and any deformation that may cause an error during the exposure operation. In some embodiments where changes are detected by the sensors, the controller 70 performs a determination based on a value of measurements by the sensors. In some embodiments, the sensors include a logic circuit programmed to generate a predetermined signal when the detected variation in measurement is not within an acceptable range.

At S1040, the voltage is applied on the particle removing electrodes 1020 that are positioned adjacent to the wafer chuck.

Subsequently, at S1050, the wafer chuck holding the wafer is moved to an exposure side of the wafer stage. In some embodiments, the particle removing assembly 1000 utilizes the wafer stage motion sub-controller 1062 in order to move the wafer chuck holding the wafer to an exposure side of the wafer stage. After the wafer chuck holding the wafer is moved to the exposure side of the wafer stage, at S1060, a lithography process is performed by EUV light.

Figure 8:
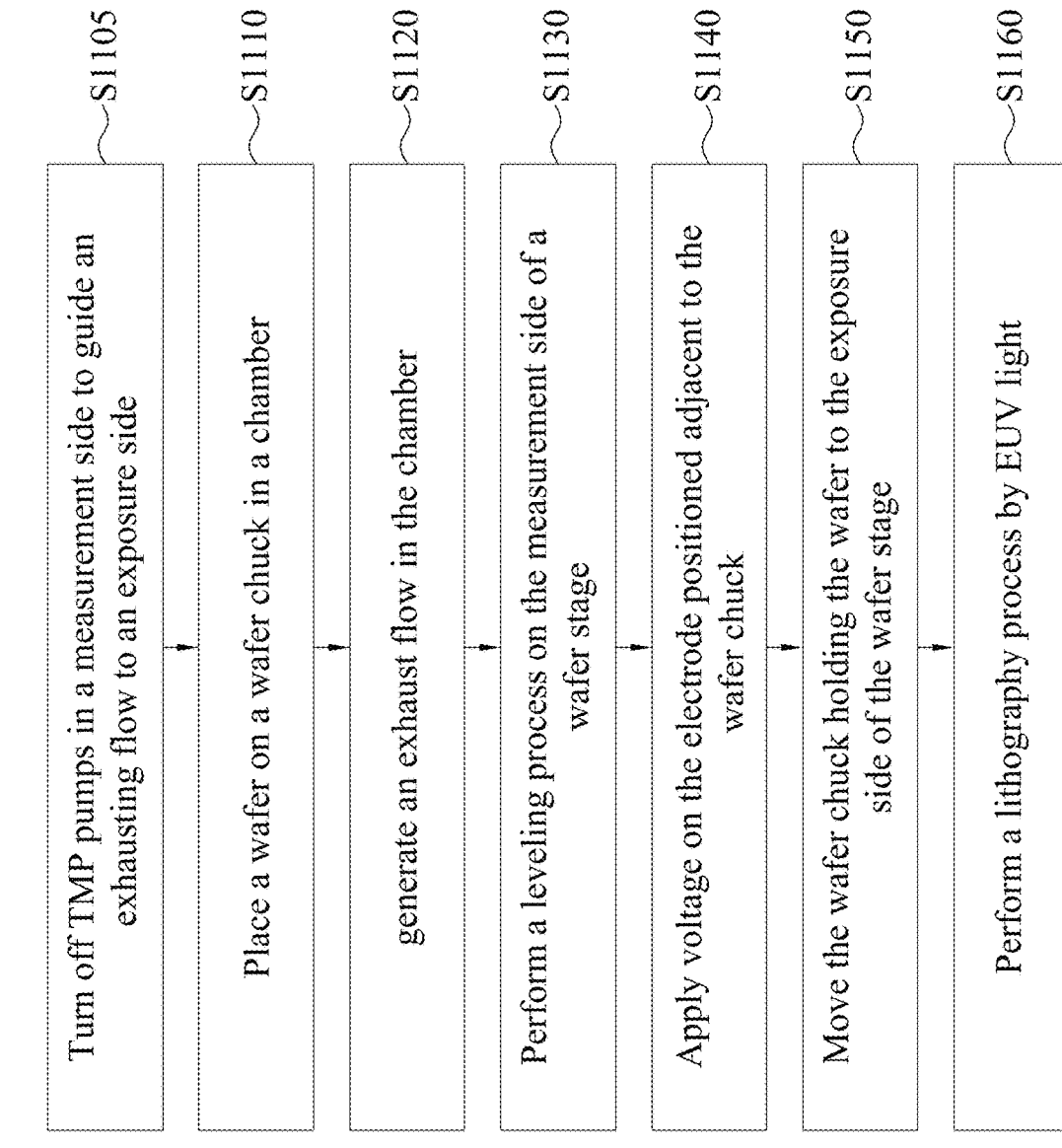
FIG. 8 illustrates a flow chart of another method of controlling the particle removing assembly in accordance with an embodiment of the present disclosure.

FIG. 8 illustrates a flow chart of another method 1100 of controlling the particle removing assembly 1000 in accordance with an embodiment of the present disclosure. The method includes, at S1105, turning off turbomolecular pumps TMP1, TMP2 in the measurement side 115 of the wafer stage 16 so that an exhaust flow can be guided to an exposure side 116 of the wafer stage 16. The method is followed by, at S1110, placing a wafer on a wafer chuck in a chamber. Then, the method includes, at S1120, generating an exhaust flow in the chamber. When the exhaust flow is generated, a leveling process is performed on a measurement side 115 of the wafer stage 16 at S1130. At S1140, a voltage is applied on the particle removing electrodes 1020 that are positioned adjacent to the wafer chuck. Subsequently, at S1150, the wafer chuck holding the wafer is moved to an exposure side of the wafer stage. After the wafer chuck holding the wafer is moved to the exposure side of the wafer stage, at S1160, a lithography process by EUV light is performed.

Figure 9:
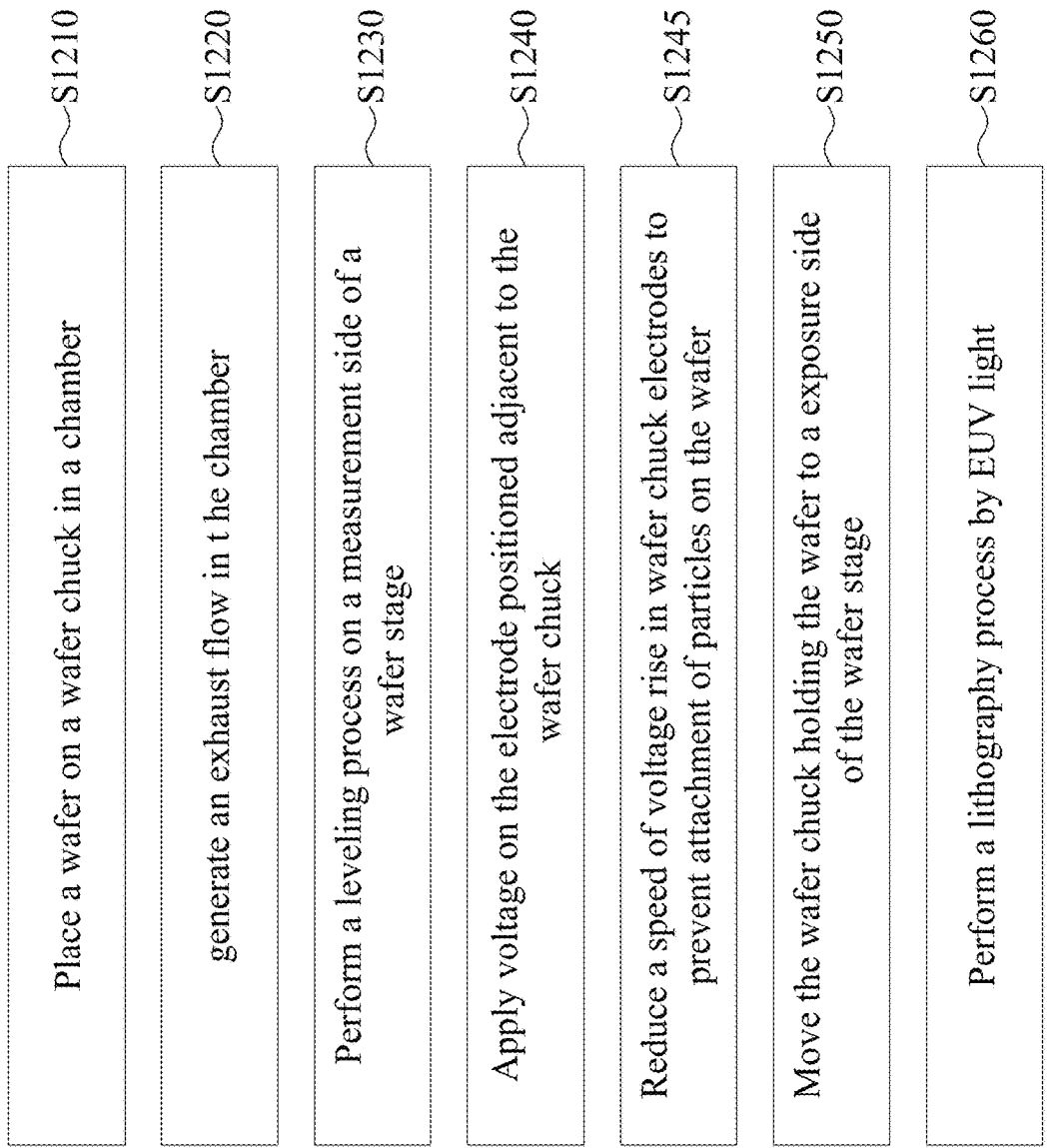
FIG. 9 illustrates a flow chart of another method of controlling the particle removing assembly in accordance with an embodiment of the present disclosure.

FIG. 9 illustrates a flow chart of yet another method 1200 of controlling the particle removing assembly 1000 in accordance with an embodiment of the present disclosure. The method includes, at S1210, placing a wafer on a wafer chuck in a chamber. Then, the method includes, at S1220, generating an exhaust flow in the chamber. When the exhaust flow is generated, a leveling process is performed at S1230 on a measurement side 115 of the wafer stage 16. At S1240, a voltage is applied on the particle removing electrodes 1020 that are positioned adjacent to the wafer chuck. Subsequently, at S1250, the wafer chuck holding the wafer is moved to an exposure side of the wafer stage. After the wafer chuck holding the wafer is moved to the exposure side of the wafer stage, at S1260, a lithography process by EUV light is performed.

Embodiments of the present disclosure provide the benefit of reducing downtime during maintenance and servicing EUV lithographic tools and masks. The design of the cleaning system and particle removing electrodes allows for faster maintenance with reduced servicing time. The adaptation of the cleaning system allows an improved process resulting in reduced manpower required to perform the maintenance, and an increased output of conforming servicing items of the EUV lithographic tools—both of which ultimately result in a cost-savings. As such, the EUV lithographic tools and masks are more efficiently used. However, it will be understood that not all advantages have been necessarily discussed herein, no particular advantage is required for all embodiments or examples, and other embodiments or examples may offer different advantages.

In accordance with one aspect of the present disclosure, a method of processing a wafer in a chamber for an extreme ultraviolet (EUV) lithographic apparatus. The EUV lithographic apparatus comprises a wafer stage including a measurement side and an exposure side and a particle removing assembly having particle removing electrodes disposed in the EUV lithographic apparatus, an exhaust device and turbomolecular pumps. A wafer on a wafer chuck in the chamber is placed. Then, an exhaust flow in the chamber is generated. After the exhaust flow is generated in the chamber, a leveling process is performed on the measurement side of the wafer stage adjacent to the turbomolecular pumps. After the leveling process is performed, a voltage is applied to the particle removing electrodes positioned adjacent to the wafer chuck. Then, the wafer chuck holding the wafer is moved to the exposure side of the wafer stage. After the wafer chuck holding the wafer is moved, a lithography process by EUV light is performed. In some embodiments, the method further turns off the turbomolecular pumps in the measurement side of the wafer stage to guide an exhaust flow to the exposure side of the wafer stage. In some embodiments, the method further reduces a speed of a rise of the voltage rise provided to electrodes of the wafer chuck. In some embodiments, the method further monitors debris particles on the wafer, then adjusts the voltage to the particle removing electrodes when an amount of the debris particles on the wafer is more than a threshold amount or greater than a threshold size, and regulates operating parameters of the turbomolecular pumps. In some embodiments, the method further provides particle removing electrodes extending along the measurement side of the wafer stage. In some embodiments, the method further provides regularly formed nano-structures on the particle removing electrodes to trap debris particles. In some embodiments, the voltage to the particle removing electrodes is provided by an alternating current (AC) power supply. In some embodiments, the voltage to the particle removing electrodes is provided by a radio frequency (RF) power supply.

In accordance with another aspect of the present disclosure, an extreme ultraviolet (EUV) lithographic apparatus comprises a wafer stage, a particle removing assembly, a chamber enclosing the wafer stage and the particle removing assembly, and a controller communicating with the particle removing assembly. The wafer stage includes a measurement side and an exposure side. The particle removing assembly comprises particle removing electrodes, an exhaust device, and turbomolecular pumps. In some embodiments, the EUV lithographic apparatus further comprises a monitoring device for monitoring debris particles on a wafer disposed on the wafer stage. In some embodiments, the EUV lithographic apparatus further comprises a measurement side particle removing electrodes extending along the measurement side of the wafer stage. In some embodiments, the particle removing electrodes include an elongated plate extending from the measurement side to the exposure side of the wafer stage. In some embodiments, the particle removing electrodes include an array of electrodes spaced apart within the particle removing electrodes. In some embodiments, the particle removing electrodes include a mesh structure extending from the measurement side to the exposure side of the wafer stage. In some embodiments, the particle removing electrodes include a plurality of pairs of electrodes embedded with a pair of particle removing electrodes affixed or attached thereto. In some embodiments, the EUV lithographic apparatus further comprises a controller configured to monitor debris particles on a surface of a wafer disposed on the wafer stage, and adjust valves of the pump when an amount of the debris particles on the wafer is more than a threshold amount or greater than a threshold size. In some embodiments, electrical potential of the particle removing electrodes are different.

In accordance with another aspect of the present disclosure, a method of processing a wafer in a chamber for an extreme ultraviolet (EUV) lithographic apparatus turns off turbomolecular pumps in a measurement side of a wafer stage to guide an exhaust flow to an exposure side of the wafer stage. Then, a wafer on a wafer chuck in a chamber is placed. When the wafer is placed, an exhaust flow in the chamber is generated. Subsequently, a leveling process is performed on the measurement side of the wafer stage adjacent to the turbomolecular pumps. When the leveling process is performed, a voltage is provided to particle removing electrodes positioned adjacent to the wafer chuck. Then, a speed of a voltage rise provided to the particle removing electrodes of the wafer chuck is reduced. Subsequently, the wafer chuck holding the wafer is moved to the exposure side of the wafer stage. When the wafer chuck holding the wafer is moved, a lithography process by EUV light is performed. In some embodiments, the method regulates a cleaning of the wafer using a controller configured to monitor debris particles on the wafer, compare an amount of the debris particles on the wafer with a threshold amount, and when the amount of the debris particles exceed the threshold amount, remove the debris particles by a pressurized cleaning material. In some embodiments, the method reduces the voltage to the particle removing electrodes when the amount of the debris particles on the wafer is below the threshold amount.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An apparatus for manufacturing a semiconductor device, the apparatus comprising:
   a wafer stage including a measurement side and an exposure side;
   at least one pump disposed on a surface of the wafer stage at the measurement side;
   a particle removing assembly; and
   a chamber enclosing the wafer stage and the particle removing assembly,
   wherein the particle removing assembly comprises a pair of particle removing electrodes provided at two opposite sides of the wafer stage so as to sandwich the wafer stage and extending from the measurement side to the exposure side, wherein a voltage is applied to the particle removing electrodes, and wherein a rising speed of the applied voltage is adjustable.

2. The apparatus of claim 1, further wherein the particle removing assembly comprises a voltage source to apply the voltage to the pair of particle removing electrodes.

3. The apparatus of claim 2, further comprising:
   a controller coupled to the voltage source to change at least one parameter selected from the group consisting of a voltage, a frequency, a duty ratio, and the rising speed.

4. The apparatus of claim 2, wherein the voltage source is a radio frequency (RF) power supply.

5. The apparatus of claim 2, wherein the voltage source is configured to supply a pulse voltage, a duty ratio of which is variable.

6. An apparatus for manufacturing a semiconductor device, the apparatus comprising:
   a wafer stage including a measurement side and an exposure side;
   at least one pump disposed on a surface of the wafer stage at the measurement side;
   a particle removing assembly comprising a pair of particle removing electrodes provided at two opposite sides of the wafer stage and extending from the measurement side to the exposure side, wherein each electrode of the pair of particle removing electrodes forms a mesh structure;
   a chamber enclosing at least the wafer stage and the particle removing assembly;
   a monitoring device configured to detect particles inside the chamber; and
   a controller coupled to the particle removing assembly, wherein the controller controls one or more parameters of the particle removing assembly based on a detection result by the monitoring device.

7. The apparatus of claim 6, wherein the pair of particle removing electrodes are provided at two sides of the wafer stage so as to sandwich the wafer stage.

8. The apparatus of claim 7, wherein the controller controls a voltage applied to the pair of particle removing electrodes when an amount of the particles detected is greater than a threshold size.

9. The apparatus of claim 7, wherein the controller controls a voltage applied to the pair of particle removing electrodes when an amount of the particles detected is more than a threshold amount.

10. The apparatus of claim 7, wherein each of the pair of particle removing electrodes includes an array of electrodes spaced apart from each other.

11. The apparatus of claim 6,
wherein the controller is configured to adjust one or more parameters of the pump when an amount of the particles detected is more than a threshold amount or greater than a threshold size.

12. An apparatus for processing a wafer, comprising:
a wafer stage including a measurement side and an exposure side;
at least one pump disposed on a surface of the wafer stage at the measurement side;
a particle removing assembly including a pair of electrodes provided at two opposite sides of the wafer stage and extending from the measurement side and the exposure side;
a vacuum chamber enclosing the wafer stage and the particle removing assembly; and
a controller, wherein
the controller is configured to perform:
moving a wafer stage in the vacuum chamber; and
applying a voltage to the pair of electrodes to collect particles generated by a movement of the wafer stage.

13. The apparatus of claim 12, wherein the voltage is a DC voltage.

14. The apparatus of claim 12, wherein the voltage is an AC voltage.

15. The apparatus of claim 14, further comprising a radio frequency (RF) power supply to provide the AC voltage.

16. The apparatus of claim 12, wherein the voltage is supplied by pulse having a duty ratio.

17. The apparatus of claim 16, wherein the duty ratio is from 10% to 90%.

18. The apparatus of claim 12, wherein the pair of electrodes are provided so as to sandwich the wafer stage.

19. The apparatus of claim 12, wherein additional electrodes are provided at corners of the vacuum chamber.

20. The apparatus of claim 12, wherein each electrode of the pair of electrodes forms a mesh structure.

* * * * *